US009811265B2

(12) United States Patent
Park et al.

(10) Patent No.: US 9,811,265 B2
(45) Date of Patent: Nov. 7, 2017

(54) BUFFER MEMORY DEVICES, MEMORY MODULES AND SOLID STATE DISKS WITH NON-UNIFORM MEMORY DEVICE CONNECTIONS

(71) Applicant: Samsung Electronics Co., Ltd., Suwon-si, Gyeonggi-do (KR)

(72) Inventors: Ji-Woon Park, Suwon-si (KR); Kwang-Soo Park, Suwon-si (KR); Byung-Ho Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/205,570

(22) Filed: Jul. 8, 2016

(65) Prior Publication Data

US 2017/0046066 A1    Feb. 16, 2017

(30) Foreign Application Priority Data

Aug. 11, 2015    (KR) .................. 10-2015-0113496

(51) Int. Cl.
| | | |
|---|---|---|
| G11C 11/34 | (2006.01) | |
| G06F 3/06 | (2006.01) | |
| G11C 5/04 | (2006.01) | |
| G11C 5/06 | (2006.01) | |
| G11C 7/02 | (2006.01) | |
| G11C 7/10 | (2006.01) | |

(52) U.S. Cl.
CPC ............ G06F 3/061 (2013.01); G06F 3/0659 (2013.01); G06F 3/0688 (2013.01); G11C 5/04 (2013.01); G11C 5/063 (2013.01); G11C 7/02 (2013.01); *G11C 7/1048* (2013.01); *G11C 2207/105* (2013.01)

(58) Field of Classification Search
CPC ...... G06F 3/061; G06F 3/0688; G06F 3/0659; G06F 12/0246; G11C 5/02; G11C 5/04; G11C 5/06
See application file for complete search history.

(56) References Cited

U.S. PATENT DOCUMENTS

| | | |
|---|---|---|
| 5,260,892 A | 11/1993 | Testa |
| 6,947,304 B1 | 9/2005 | Yen |
| 6,983,023 B2 | 1/2006 | Osaka et al. |
| 7,102,221 B2 | 9/2006 | Miyamoto et al. |
| 7,133,962 B2 | 11/2006 | Leddige et al. |
| 7,161,820 B2 | 1/2007 | Funaba et al. |
| 7,257,725 B2 | 8/2007 | Osaka et al. |

(Continued)

*Primary Examiner* — Toan Le
(74) *Attorney, Agent, or Firm* — Ward and Smith, P.A.

(57) ABSTRACT

A memory module includes at least two rows of memory device packages on a substrate and coupled to a control signal line. A first memory device package in a first row is connected to the control signal line at a first point closest to the proximal end of the control signal line and a second memory device in a second row is connected to the control signal line at a second point next closest to the first point. A signal trace length between the first memory device and the second memory device may be greater than a signal trace length between the first memory device package and a third memory device package immediately adjacent the first memory device package in the first row or a signal trace length between the second memory device package and a fourth memory device package immediately adjacent the second memory device package in the second row.

19 Claims, 6 Drawing Sheets

(56) References Cited

U.S. PATENT DOCUMENTS

| | | |
|---|---|---|
| 7,919,841 B2 | 4/2011 | Park et al. |
| 8,375,240 B2 | 2/2013 | Matsui |
| 2004/0071040 A1* | 4/2004 | Funaba .................... G11C 5/04 365/232 |
| 2008/0179649 A1* | 7/2008 | Park ..................... H05K 1/0246 257/296 |
| 2013/0194854 A1* | 8/2013 | Shaeffer .................. G11C 5/04 365/63 |
| 2014/0301125 A1* | 10/2014 | Yoon ...................... G11C 7/109 365/63 |
| 2015/0301977 A1* | 10/2015 | Gervasi .............. G06F 13/4234 711/105 |

* cited by examiner

BUFFER MEMORY DEVICES, MEMORY MODULES AND SOLID STATE DISKS WITH NON-UNIFORM MEMORY DEVICE CONNECTIONS

PRIORITY STATEMENT

This application claims priority under 35 U.S.C. §119 to Korean Patent Application No. 10-2015-0113496, filed on Aug. 11, 2015 in the Korean Intellectual Property Office (KIPO), the contents of which are herein incorporated by reference in their entirety.

BACKGROUND

Example embodiments relate to memory modules and solid state disks and, more particularly, to communications interconnections for memory modules and solid state disks incorporating the same.

As a data capacity of storage devices such as solid state disks (SSDs), has increased, the memory capacity and occupied area of DRAM packages serving as a mapping table/buffer memory have increased correspondingly. However, spacing between DRAM packages and between an SSD controller and DRAM packages may be reduced due to space limitations of the storage device. Consequently, reflection noise may be increased, which may cause deterioration of signal integrity. This may negatively affect reliability in high speed communications.

SUMMARY

Example embodiments provide memory modules having a signal connection configuration capable of improving signal transmission properties.

Example embodiments provide solid state disks including such memory modules.

According to some embodiments, a memory module includes a substrate, a control signal line on and/or in the substrate and having a proximal end configured to be coupled to a controller, and at least two rows of memory device packages on the substrate and connected to the control signal line at respective connection points. A first memory device package in a first row is connected to the control signal line at a first connection point closest to the proximal end of the control signal line and a second memory device in a second row is connected to the control signal line at a second connection point next closest to the first connection point. A signal trace length between the first memory device and the second memory device may be greater than a signal trace length between the first memory device package and a third memory device package immediately adjacent the first memory device package in the first row or a signal trace length between the second memory device package and a fourth memory device package immediately adjacent the second memory device package in the second row.

In some embodiments, the signal trace length between the first and third memory device packages may be substantially the same as the signal trace length between the second and fourth memory device packages.

In further embodiments, the substrate may include a module board and at least a portion of the control single line may include a microstrip or a strip line on and/or in the module board.

The memory device packages and the control signal line may be arranged by in a fly-by configuration. A control signal maybe applied sequentially to the semiconductor packages along the control signal line. The control signal line may include a command/address signal line or a clock signal line. The memory module may further include a termination resistor connected to a distal end of the control signal line. The memory device packages may be connected to respective data signal lines and data signals may be input to and output from the memory device packages through the data signal lines. The memory device packages may each include at least one DRAM chip.

In some embodiments, another memory device package in the first row may be connected to the control signal line at a third connection point next closest to the second connection point or another memory device package of the second row is connected to the control signal line at a third connection point next closest to the second connection point. A memory device package in a third row may be connected to the control signal line at a third connection point next closest to the second connection point.

The module may further include the controller. The module may further include a plurality of non-volatile memory devices connected to the controller, wherein the memory device packages serve as a buffer configured to temporarily store data read from the non-volatile memory devices.

Further embodiments of the inventive subject matter may provide a solid state disk including a plurality of non-volatile memory devices, a controller configured to read data from the non-volatile memory devices, and a buffer memory device configured to temporarily store the data read from the non-volatile memory devices. The buffer memory device includes a control signal line having a proximal end coupled to the controller and at least two rows of memory device packages coupled to the control signal line. A first memory device package in a first row is connected to the control signal line at a first connection point closest to the proximal end of the control signal line and a second memory device in a second row is connected to the control signal line at a second connection point next closest to the first connection point.

In some embodiments, a signal trace length between the first memory device and the second memory device may be greater than a signal trace length between the first memory device package and a third memory device package immediately adjacent the first memory device package in the first row or a signal trace length between the second memory device package and a fourth memory device package immediately adjacent the second memory device package in the second row. The memory device packages and the control signal line may be arranged by in a fly-by configuration. The control signal line may include a command/address signal line or a clock signal line. The solid state disk may further include a termination resistor connected to a distal end of the control signal line.

The memory device packages may be connected to respective data signal lines and data signals are input to and output from the memory device packages through the data signal lines. The memory device packages may each include at least one DRAM chip.

In some embodiments, another memory device package in the first row may be connected to the control signal line at a third connection point next closest to the second connection point or another memory device package of the second row may be connected to the control signal line at a third connection point next closest to the second connection point. In some embodiments, a memory device package in a third row may be connected to the control signal line at a third connection point next closest to the second connection point.

According to additional embodiments, a buffer memory device includes a control signal line having a proximal end configured to be coupled to a controller and a plurality of memory device packages connected to the control signal line at respective connection points in a fly-by configuration. A first distance between a first connection point closest to the proximal end and a second connection point next closest to the first connection point is different than a second distance between the second connection point and a third connection point next closest to the second connection point.

In some embodiments, the memory device packages may be arranged in rows, and a first memory device package connected at the first connection point may be in a first row and a second memory device package connected at the second connection point may be in a second row. A third memory device package connected at the third connection point may be in the first row or the second row.

In some embodiments, a third memory device is in a third row. The third row may be disposed between the first and second rows or the second row may be disposed between the first and third rows.

The control signal line may include a command/address signal line or a clock signal line. The buffer memory device may further include a termination resistor connected to a distal end of the control signal line.

BRIEF DESCRIPTION OF THE DRAWINGS

Example embodiments will be more clearly understood from the following detailed description taken in conjunction with the accompanying drawings. FIGS. 1 to 10 represent non-limiting, example embodiments as described herein.

DETAILED DESCRIPTION

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of components or elements may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element or layer is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
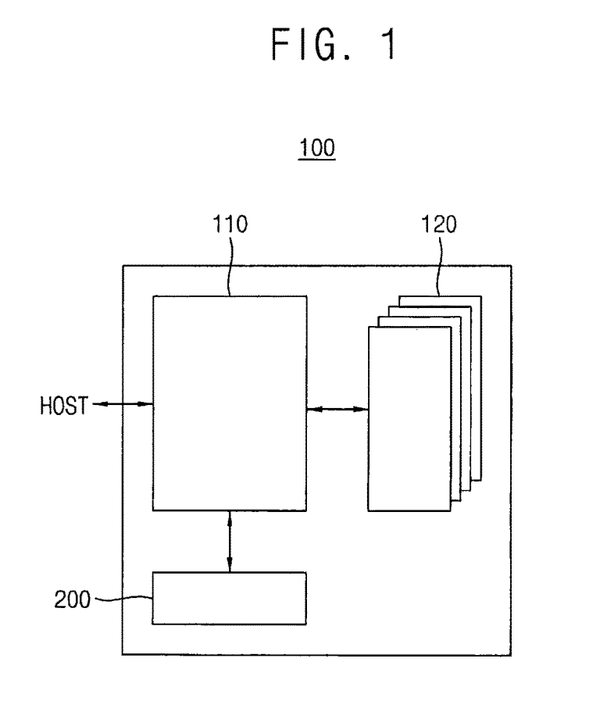
FIG. 1 is a block diagram illustrating a solid state disk in accordance with some example embodiments.
Figure 2:
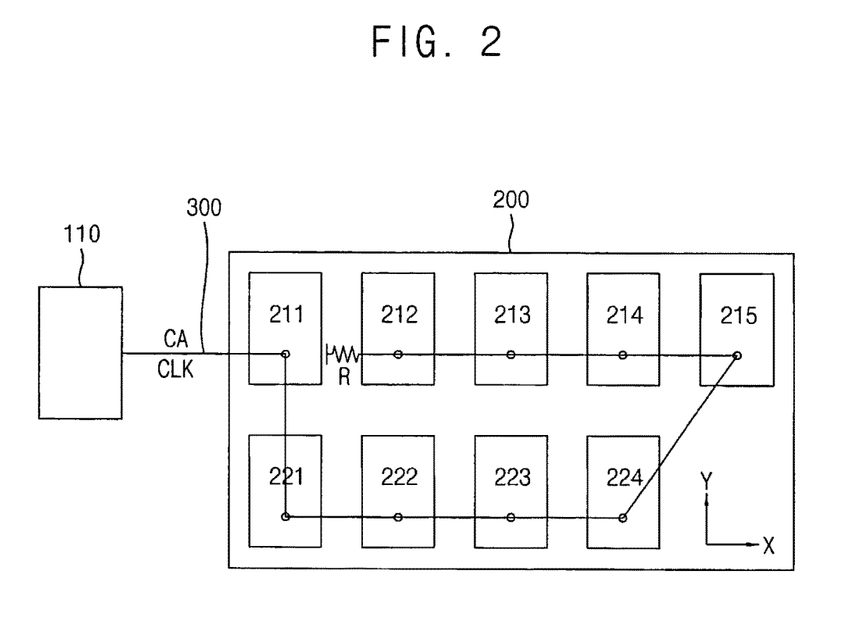
FIG. 2 is a block diagram illustrating a buffer memory device of the solid state disk of FIG. 1.
Figure 3:
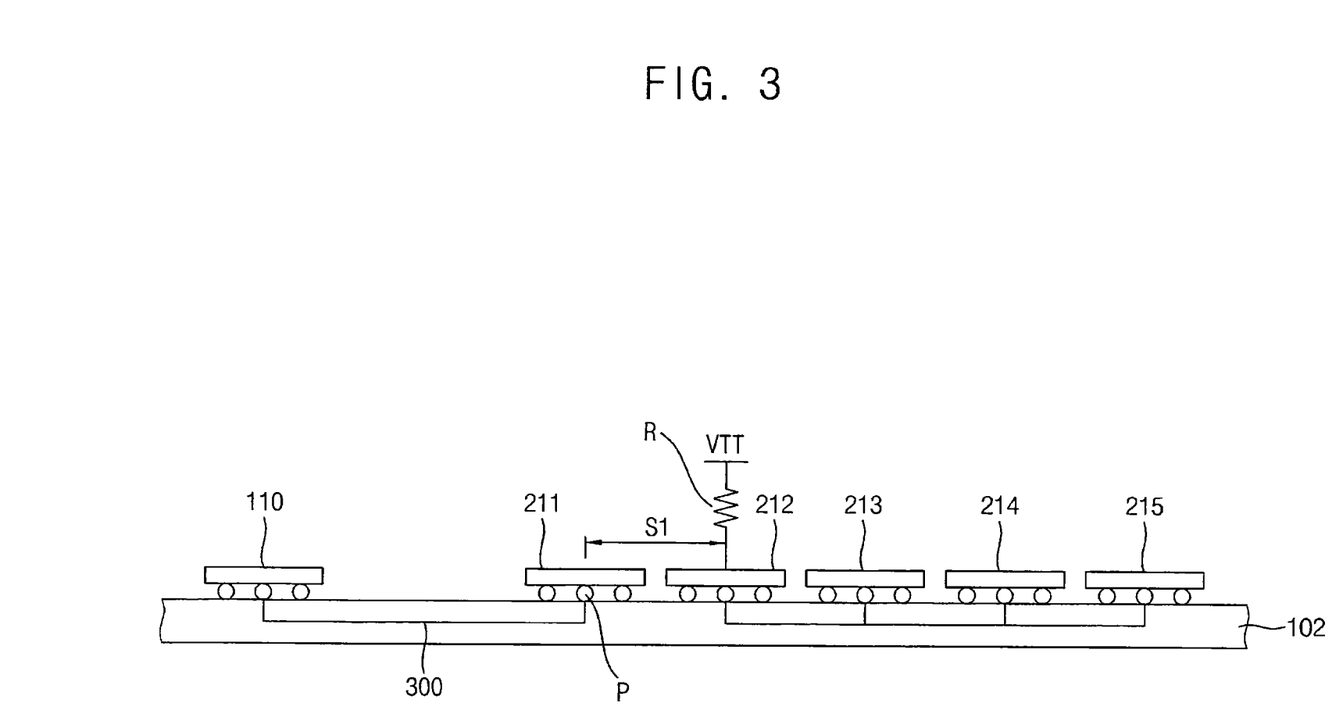
FIG. 3 is a cross-sectional view illustrating a structure of the buffer memory device of FIG. 1.
Figure 4:
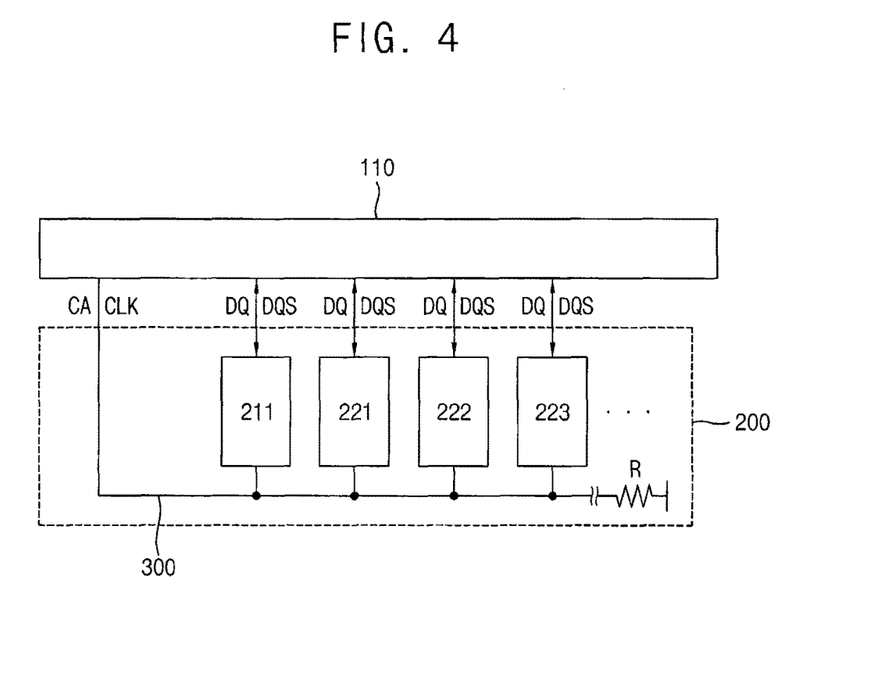
FIG. 4 is a block diagram illustrating transmission of signals in the buffer memory device of FIG. 1.
Figure 5:
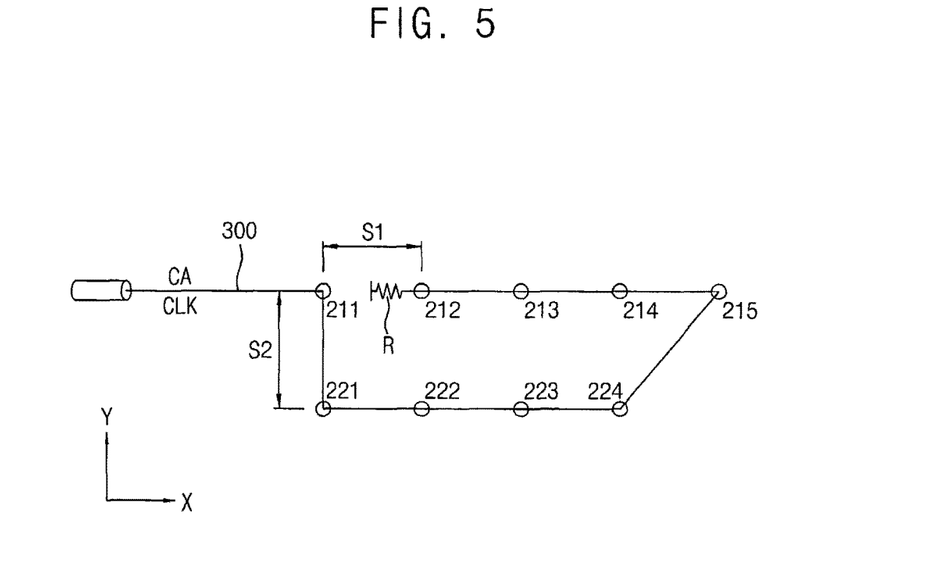
FIG. 5 is a view illustrating a signal connection configuration including a topology of the buffer memory device of FIG. 1.

FIG. 1 is a block diagram illustrating a solid state disk in accordance with some example embodiments. FIG. 2 is a block diagram illustrating a buffer memory device of the solid state disk of FIG. 1. FIG. 3 is a cross-sectional view illustrating a structure of the buffer memory device of FIG. 1. FIG. 4 is a block diagram illustrating transmission of signals in the buffer memory device of FIG. 1. FIG. 5 is a view illustrating a signal connection configuration including a topology of the buffer memory device of FIG. 1.

Referring to FIGS. 1 to 5, a solid state disk (SSD) 100 may include an SSD controller 110, a plurality of non-volatile memory devices 120 and a buffer memory device 200.

In example embodiments, the SSD controller 110, the non-volatile memory devices 120 and the buffer memory device 200 may be mounted on a module board 102, configured to serve as a memory module. The SSD 100 may use non-volatile memories, e.g., flash memory, as a storage device, and can store large amounts of data (e.g., 1 TB or more).

The SSD 100 may be used to replace a hard disk in a PC, notebook, etc. The SSD 100 may be also used in a mobile device, such as smart phone, tablet PC, digital camera, MP3 player, PDA, etc. The SSD may be a device that can be attached to or detached from a host. The SSD may be additionally attached to a host to enlarge a storage space of the host.

The SSD controller 110 may communicate with the host. Signals communicated between the SSD controller 110 and the host may include commands, addresses, data, etc. The SSD controller 110 may analyze and process signals communicated from the host.

A plurality of the non-volatile memory devices 120 may be used as a storage medium of the SSD 100. For example, the non-volatile memory devices 120 may include NAND flash memory devices or other types of non-volatile memory devices, such as PRAM, MRAM, ReRAM, or FRAM devices, or volatile memory devices, such as SRAM devices. The non-volatile memory devices 120 may be connected to the SSD controller 110 through at least one channel CH.

The buffer memory device 200 may be used as a buffer area that temporarily stores data received from the host or data read from the non-volatile memory devices 120. The buffer memory device 200 may be also used to drive software used for an effective management of the non-volatile memory devices 120. Further, the buffer memory device 200 may be used to store metadata received from the host and/or may be used to store cache data.

In some embodiments, the buffer memory device 200 may include a plurality of DRAM packages. Each DRAM package may include a package substrate and at least one DRAM chip mounted on the package substrate.

The SSD 100 may further include a pad for connection with the host. The SSD 100 may be attached to and detached from the host through the pad. The pad may be formed in the form of a connector inside the SSD 100 or outside the SSD 100. Alternatively, the SSD 100 may be connected to the host through a routing process without the pad.

The SSD controller 110 may communicate the signal with the host using a host interface. The host interface may include, for example, a universal serial bus (USB), a small computer system interface (SCSI), a PCI express, an ATA, a parallel ATA, a serial ATA, a serial attached SCSI, etc. The host interface may perform a function of disk emulation so that the host recognizes the SSD 100 as a hard disk drive (HDD).

The non-volatile memory devices 120 may be connected to the SSD controller 110 through a first interface and the buffer memory device 200 may be connected to the SSD controller 110 through a second interface.

Data received from the host or data transmitted from the buffer memory device 200 may be distributed to the non-volatile memory devices 120 via the first interface. Data read from the non-volatile memory devices 120 via the first interface may be transmitted to the host via the host interface and/or may be transmitted to the buffer memory device 200 via the second interface.

A central processing unit of the SSD controller 110 may control an overall operation of the SSD controller 110. The central processing unit of the SSD controller 110 may control the flash memories and the DRAM packages through the first interface and the second interface.

In example embodiments, the buffer memory device 200 may include a plurality of DRAM packages mounted on the module board 102. The number of the DRAM packages used may depend on the data capacity of the SSD 100. As the data capacity of the SSD 100 is increased, a memory capacity of the buffer memory device 200 may be increased proportionally.

For example, if the SSD 100 is an 8 TB device, the buffer memory device 200 may have a capacity of 9 GB. This may be provided by 9 DRAM packages. Each of the DRAM packages may have a memory capacity of 8 Gb. The number of the DRAM packages may not be limited thereto.

As illustrated in FIG. 2, a plurality of the DRAM packages may include at least two rows spaced apart along a first direction (e.g., the Y direction shown in FIG. 2). The first row may include 5 DRAM packages 211, 212, 213, 214 and 215 spaced apart along a second direction (e.g., the X direction shown in FIG. 2) substantially perpendicular to the first direction. The second row may include 4 DRAM packages 221, 222, 223 and 224 spaced apart along the second direction. The DRAM packages in the first row may be referred to herein as "first row DRAM packages," and the DRAM packages in the second row may be referred to herein as "second row DRAM packages."

The buffer memory device 200 may use a bus that is implemented by a fly-by topology. The DRAM packages may be connected to the bus at respective connection points along the bus. The DRAM packages may be connected at connection points along a control signal line 300, and a control signal output from the SSD controller 110 as a control chip may be transmitted to the DRAM packages along the control signal line 300. The control signal may include a command/address (CA) signal or a clock signal (CLK). Additionally, the DRAM packages may be connected to the SSD controller 110 through data signal lines, and a data signal (DQ signal) may be input/output to/from each of the DRAM packages through the data signal lines.

The buffer memory device 200 may be implemented using an on-die termination circuit (ODT). A termination resistor R may be connected to a distal end of the bus, that is, control signal line 300, to match impedance of the bus when data is communicated through the bus between parts (for example, semiconductor packages). The terminal resistor R may be mounted adjacent to a voltage termination terminal (VTT) on the module board 102.

The DRAM packages may be sequentially connected to the control signal line 300, and may perform access operations, for example, write operations and read operations, simultaneously in response to the control signals transmitted through the control signal line 300.

As illustrated in FIGS. 3 and 4, the module board 102 may be a multi-layered circuit board having multiple layers, such as power/GND layer. At least a portion of the control single line 300 may include a microstrip or a strip line formed on a surface of the module board 102 or formed therein. The DRAM packages may be mounted on the module board 102 through signal connection members, such as solder balls P disposed on pins (connection pads) on a lower surface of the package substrate.

A signal trace length between the pins of the adjacent first row DRAM packages connected to the strip line (pin-to-pin distance between the first row DRAM packages) may be set to a first distance S1. A signal trace length between the pins of the adjacent first row and second row DRAM packages may be set to a second distance S2. The second distance S2 may be greater than the first distance S1. For example, the first distance S1 and the second distance S2 may satisfy Equation (1):

$$S2 \geq 1.2 \times S1 \quad (1)$$

A signal trace length between the pins of the adjacent second row DRAM packages may be set to be substantially the same as the first distance S1. As described later, in order to reduce noise due to signal reflection, the signal trace length between the adjacent DRAM packages of the different rows may be set to be greater than the signal trace length between the adjacent DRAM packages of the same row.

In example embodiments, a signal connection order of the first row and second row DRAM packages along the control signal line 300 from the SSD controller 110 may involve a DRAM package connected firstly (i.e., closest to the proximal end of the control signal line 300 where it is coupled to the SSD controller 110) to the control signal line 300 being one of the first row DRAM packages, a DRAM package connected secondly (i.e., at a connection point next closest to the proximal end) to the control signal line 300 being one of the second row DRAM packages, not the first row DRAM packages. That is, any one of the first row DRAM packages 211, 212, 213, 214 and 215 may be connected firstly to the control signal line 300 and any one of the second row DRAM packages 221, 222, 223 and 224 may be connected secondly to the control signal line 300. Additionally, another package of the second row DRAM packages may be connected thirdly (i.e., at a connection point third closest to the proximal end) to the control signal line 300.

As illustrated in FIG. 5, a DRAM package firstly connected to the control signal line 300 may be the first package 211 of the first row DRAM packages, and a DRAM package secondly connected to the control signal line 300 may be the first package 221 of the second row DRAM packages. A control signal output from the SSD controller 110 may pass from the first package 211 of the first row DRAM packages to the first to fourth packages 221, 222, 223 and 224 of the second row DRAM packages, and pass on to the fifth to second packages 215, 214, 213 and 212 of the first row DRAM packages again.

When a control signal is applied to the DRAM packages, signal reflection may be generated at a boundary where the control signal line 300 and a package are connected due to a difference in impedance between the control signal line 300 and a part, for example, the DRAM package, connected to the control signal line 300. A reflective wave resulting from the signal reflection may proceed in a direction opposite to a direction in which the original wave (the control signal) proceeds, becoming noise on the control signal line 300. In general, the noise generated due to the reflected wave may have the greatest effect at the foremost end of the control signal line, for example, at the boundary at the package firstly connected to the control signal line 300.

If the first row DRAM packages and the second row DRAM packages are sequentially connected to a control signal line, a control signal output from an SSD controller may pass by the first row DRAM packages and then pass by the second row DRAM packages. In this case, the control signal may overlap reflective waves generated from the next packages including a second package of the first row DRAM packages in the previous period at the boundary portion where the first package of the first row DRAM packages is connected to the control signal. As a result, a poor eye diagram may be obtained.

In example embodiments, the signal trace length between immediately adjacent first row and second row DRAM packages may be set to be greater than the signal trace length between immediately adjacent DRAM packages of the same row. Thus, the timing at which the reflective waves are overlapped at a particular cycle may be avoided by setting the time point when the control signal is applied and the time point when the reflective waves generated in the previous cycle proceed back to the firstly connected package to be different from each other. Therefore, at least two rows of the DRAM packages having the above-mentioned signal connection order and arrangement may be disposed within the limited area of the SSD to increase a buffer memory capacity required for the huge amounts of data of the SSD, as well as to improve signal integrity of the memory module. Further, a signal connection configuration between the DRAM packages arranged by a fly-by topology adapted for high speed communications may be adjusted to improve signal integrity.

Figure 6:
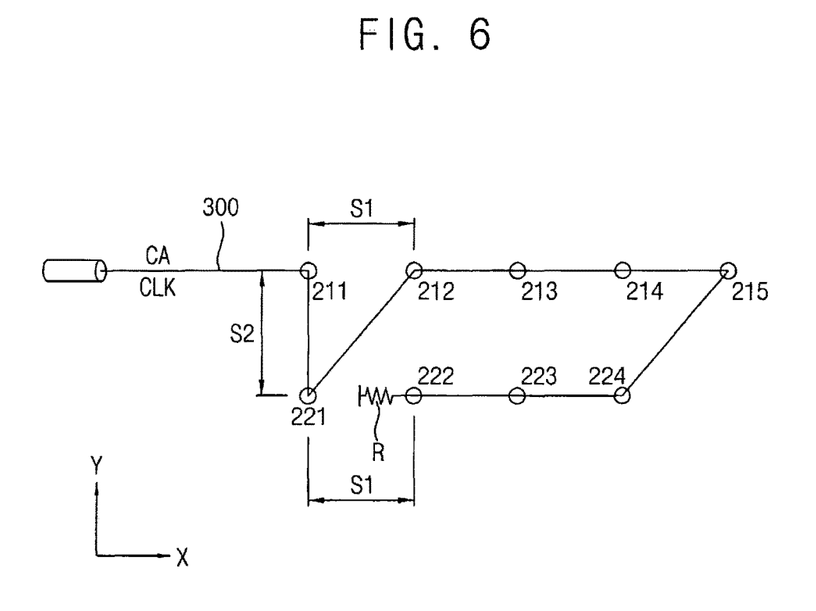
FIG. 6 is a view illustrating a signal connection configuration of a buffer memory device in accordance with example embodiments.

FIG. 6 is a view illustrating a signal connection configuration of a buffer memory device in accordance with example embodiments. The buffer memory device may be substantially the same as or similar to the buffer memory device described with reference to FIGS. 1 to 5, except for a signal connection configuration of DRAM packages. Thus, same reference numerals will be used to refer to the same or like elements as those described in the buffer memory device described with reference to FIGS. 1 to 5, and any further repetitive explanation concerning the above elements will be omitted.

Referring to FIG. 6, a buffer memory device may be mounted on a module board, and may include a control signal line 300 for transmitting a control signal and a plurality of DRAM packages mounted on the module board and sharing the control signal line 300.

A plurality of the DRAM packages may include at least two rows of packages arranged in a first direction (Y direction) on the module board. The first row of the packages may include 5 DRAM packages 211, 212, 213, 214 and 215 arranged in a second direction (X direction) substantially perpendicular to the first direction, and the second row of the packages may include 4 DRAM packages 221, 222, 223 and 224 arranged in the second direction.

In example embodiments, a DRAM package firstly connected to the control signal line 300 may be the first package 211 of the first row DRAM packages, a DRAM package secondly connected to the control signal line 300 may be the first package 221 of the second row DRAM packages immediately adjacent the first package 211 of the first row of DRAM packages, and a DRAM package thirdly connected to the control signal line 300 may be the second package 212 immediately adjacent the first package 221 of the second row of DRAM packages. The control signal output from a SSD controller 110 may pass from the first package 211 of the first row DRAM packages to the first package 221 of the second row DRAM packages, on to the second to fifth packages 212, 213, 214 and 215 of the first row DRAM packages, and to the fourth packages 224, 223 and 222 of the second row DRAM packages.

A signal trace length between connection pads of the immediately adjacent first row DRAM packages connected to the control signal line 300 may be set to a first distance S1. A signal trace length between the connection pads of the immediately adjacent first row and second row DRAM packages may be set to a second distance S2. The second distance S2 may be greater than the first distance S1. A signal trace length between the connection pads of the adjacent second row DRAM packages may be set to be substantially the same as the first distance S1.

In example embodiments, the first and second DRAM packages may be arranged such that the signal trace length between the firstly connected DRAM package 211 and the secondly connected DRAM package 221 may be set to be greater than the signal trace length between the adjacent DRAM packages of the same row. Additionally, the signal trace length from the firstly connected DRAM package 211 to the secondly connected DRAM package 221 may be set to be different from the signal trace length between the secondly connected DRAM package 221 and the thirdly connected DRAM package 212. For example, the signal trace length between the firstly connected DRAM package 211 and the secondly connected DRAM package 221 may be set to be less than the signal trace length between the secondly connected DRAM package 221 and the thirdly connected DRAM package 212.

Thus, the time point when a control signal is applied and the time point when reflective waves generated in the previous cycle proceed back to the firstly connected DRAM package may different from each other, so that the reflective waves may not be overlapped at a particular cycle, thereby potentially reducing signal distortion.

Figure 7:
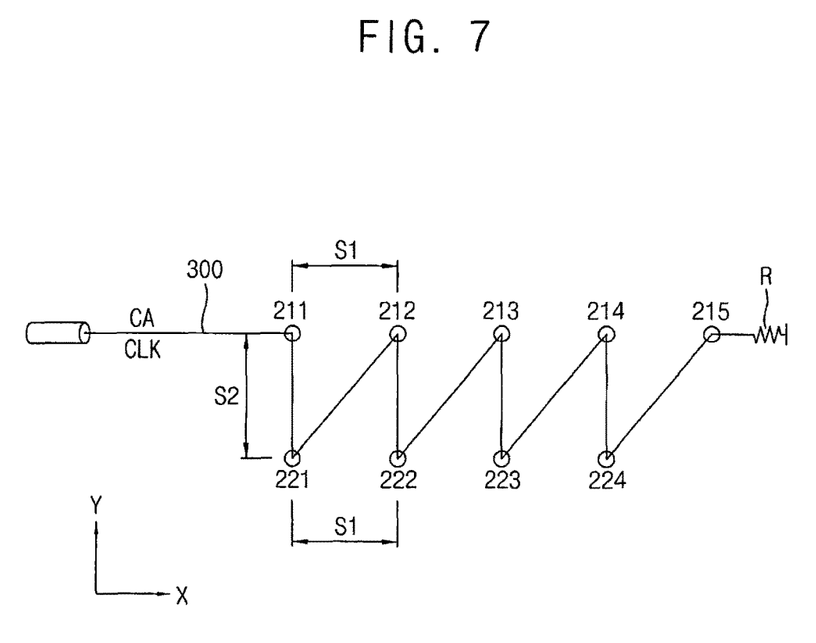
FIG. 7 is a view illustrating a signal connection configuration of a buffer memory device in accordance with example embodiments.

FIG. 7 is a view illustrating a signal connection configuration of a buffer memory device in accordance with example embodiments. The buffer memory device may be substantially the same as or similar to the buffer memory device described with reference to FIG. 6, except for a signal connection configuration of DRAM packages. Thus, same reference numerals will be used to refer to the same or like elements as those described in the buffer memory device described with reference to FIG. 6, and any further repetitive explanation concerning the above elements will be omitted.

Referring to FIG. 7, a plurality of the DRAM packages may include at least two rows of packages arranged in a first direction (Y direction) on a module board. The first row of the packages may include 5 DRAM packages 211, 212, 213, 214 and 215 arranged in a second direction (X direction) substantially perpendicular to the first direction, and the second row of the packages may include 4 DRAM packages 221, 222, 223 and 224 arranged in the second direction.

In example embodiments, any one of the first row DRAM packages 211, 212, 213, 214 and 215 may be connected firstly to a control signal line 300, any one of the second row DRAM packages 221, 222, 223 and 224 may be connected secondly to the control signal line 300, another package of the first row DRAM packages may be connected thirdly to the control signal line 300, and another package of the second row DRAM packages may be connected fourthly to the control signal line 300.

In particular, a DRAM package firstly connected to the control signal line 300 may be the first package 211 of the first row DRAM packages, a DRAM package secondly connected to the control signal line 300 may be the first package 221 of the second row DRAM packages, a DRAM package thirdly connected to the control signal line 300 may be the second package 212 of the first row DRAM packages, and a DRAM package fourthly connected to the control signal line 300 may be the second package 222 of the second row DRAM packages. The control signal output from a SSD controller may pass from the first package 211 of the first row DRAM packages to the first package 221 of the second row DRAM packages, and then alternately to the first row and the second row DRAM packages.

Thus, the time point when the control signal is applied and the time point when reflective waves generated in the previous cycle proceed back to the firstly connected DRAM package may be different from each other, so that the reflective waves may not be overlapped at a particular cycle, thereby potentially reducing signal distortion.

Figure 8:
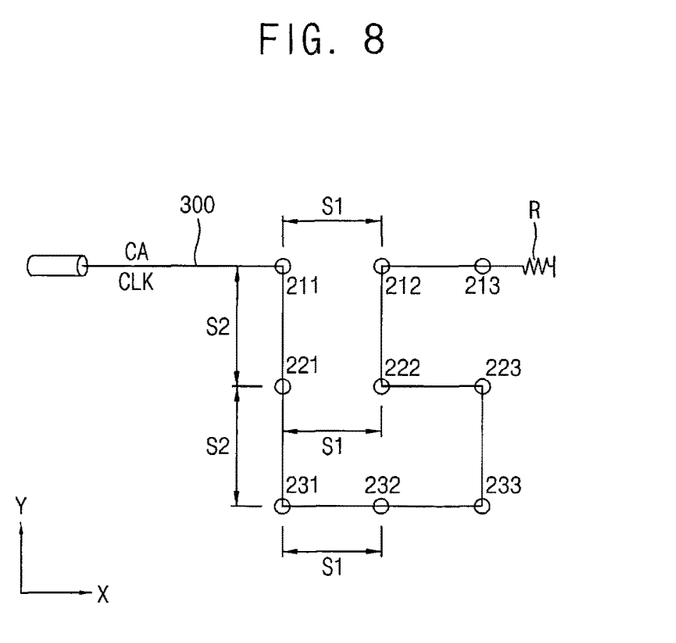
FIG. 8 is a view illustrating a signal connection configuration of a buffer memory device in accordance with example embodiments.

FIG. 8 is a view illustrating a signal connection configuration of a buffer memory device in accordance with example embodiments. The buffer memory device may be substantially the same as or similar to the buffer memory device described with reference to FIGS. 1 to 5, except for a signal connection configuration of DRAM packages. Thus, same reference numerals will be used to refer to the same or like elements as those described in the buffer memory device described with reference to FIGS. 1 to 5, and any further repetitive explanation concerning the above elements will be omitted.

Referring to FIG. 8, a buffer memory device may be mounted on a module board, and may include a control signal line 300 for transmitting a control signal and a plurality of DRAM packages mounted on the module board and connected to the control signal line 300.

A plurality of the DRAM packages may include three rows packages arranged in a first direction (Y direction) on the module board. The first row of the packages may include 3 DRAM packages 211, 212 and 213 arranged in a second direction (X direction) substantially perpendicular to the first direction, the second row of the packages may include 3 DRAM packages 221, 222 and 223 arranged in the second direction, and the third row of the packages may include 3 DRAM packages 231, 232 and 233 arranged in the second direction.

In example embodiments, any one of the first row DRAM packages 211, 212 and 213 may be connected firstly to the control signal line 300, any one of the second row DRAM packages 221, 222 and 223 may be connected secondly to the control signal line 300, and any one of the third row DRAM packages 231, 232 and 233 may be connected thirdly to the control signal line 300.

In particular, a DRAM package firstly connected to the control signal line 300 may be the first package 211 of the first row DRAM packages, a DRAM package secondly connected to the control signal line 300 may be the first package 221 of the second row DRAM packages, and a DRAM package thirdly connected to the control signal line 300 may be the first package 231 of the third row DRAM packages. A control signal may pass to the first package 211 of the first row DRAM packages, to the first package 221 of the second row DRAM packages, to the first package 231 of the third row DRAM packages, and sequentially to the third row, second row and first row DRAM packages.

A signal trace length between connection pads of the adjacent DRAM packages of the same row may be set to a first distance S1. A signal trace length between the connection pads of the adjacent DRAM packages of the different rows may be set to a second distance S2. The second distance S2 may be greater than the first distance S1.

Figure 9:
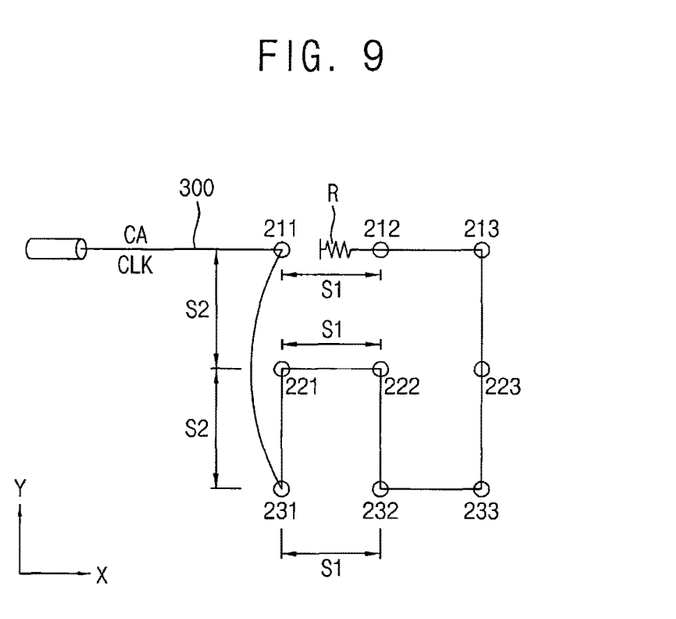
FIG. 9 is a view illustrating a signal connection configuration of a buffer memory device in accordance with example embodiments.

FIG. 9 is a view illustrating a signal connection configuration of a buffer memory device in accordance with example embodiments. The buffer memory device may be substantially the same as or similar to the buffer memory device described with reference to FIG. 8, except for a signal connection configuration of DRAM packages. Thus, same reference numerals will be used to refer to the same or like elements as those described in the buffer memory device described with reference to FIG. 8, and any further repetitive explanation concerning the above elements will be omitted.

Referring to FIG. 9, a plurality of the DRAM packages may include three rows of packages arranged in a first direction (Y direction) on a module board. The first row of the packages may include 3 DRAM packages 211, 212 and 213 arranged in a second direction (X direction) substantially perpendicular to the first direction, the second row of the packages may include 3 DRAM packages 221, 222 and 223 arranged in the second direction, and the third row of the packages may include 3 DRAM packages 231, 232 and 233 arranged in the second direction.

In example embodiments, any one of the first row DRAM packages 211, 212 and 213 may be connected firstly to the control signal line 300, any one of the third row DRAM packages 231, 232 and 233 may be connected secondly to the control signal line 300, and any one of the second row DRAM packages 221, 222 and 223 may be connected thirdly to the control signal line 300.

In particular, a DRAM package firstly connected to the control signal line 300 may be the first package 211 of the first row DRAM packages, a DRAM package secondly connected to the control signal line 300 may be the first package 231 of the third row DRAM packages, and a DRAM package thirdly connected to the control signal line 300 may be the first package 221 of the second row DRAM packages. A control signal may pass to the first package 211 of the first row DRAM packages, to the first package 231 of the third row DRAM packages, pass by the first package 221 of the second row DRAM packages, and sequentially to the second row, third row and first row DRAM packages.

The signal trace length (2×S2) between the firstly connected DRAM package 211 and the secondly connected DRAM package 231 may be greater than the signal trace length (S2) between the secondly connected DRAM package 231 and the thirdly connected DRAM package 221, and the signal trace length (S2) between the secondly connected DRAM package 231 and the thirdly connected DRAM package 221 may be greater than the signal trace length (S1) between the thirdly connected DRAM package 221 and the fourthly connected DRAM package 222.

Thus, the time point when the control signal is applied and the time point when reflective waves generated in the previous cycle proceed back to the firstly connected DRAM package, may be different from each other, so that the reflective waves may not be overlapped at a particular cycle, thereby potentially reducing signal distortion.

Figure 10:
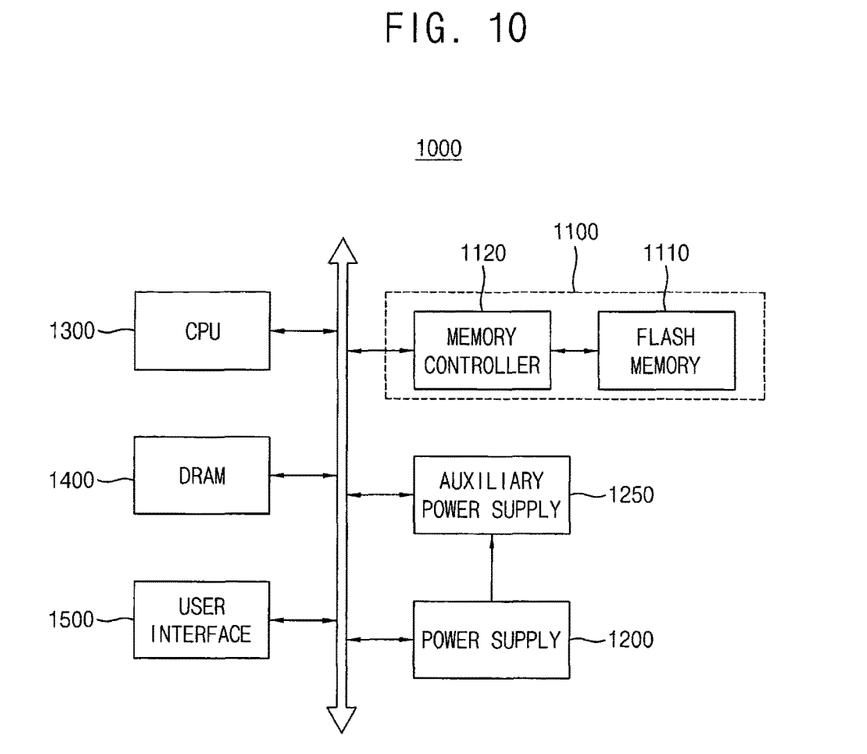
FIG. 10 is a block diagram illustrating an electronic device in accordance with example embodiments.

FIG. 10 is a block diagram illustrating an electronic device in accordance with example embodiments.

Referring to FIG. 10, an electronic device 1000 may include a memory system 1100, a power supply 1200, an auxiliary power supply 1250, a central processing unit 1300, a DRAM 1400, and a user interface 1500. The memory system 1100 may include a flash memory 1110 and a memory controller 1120. The memory system 1100 may be embodied as the SSD according to example embodiments. The electronic device 1000 may be embodied by a personal computer PC or a portable electronic device such as a notebook, a cell phone, a personal digital assistant (PDA) and a camera.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A memory module, comprising:
   a substrate;
   a control signal line on and/or in the substrate and having a proximal end configured to be coupled to a controller; and
   at least two rows of memory device packages on the substrate and individually coupled to the control signal line at respective connection points spaced along the control signal line such that the control signal line runs from memory device package to memory device package, wherein a first memory device package in a first row is connected to the control signal line at a first connection point closest to the proximal end of the control signal line and a second memory device package in a second row is connected to the control signal line at a second connection point next closest to the first connection point.

2. The memory module of claim 1, wherein a signal trace length along the control signal line between the first connection point and the second connection point is greater than a distance between the first connection point and a third connection point of a third memory device package immediately adjacent the first memory device package in the first row or a distance between the second connection point and a fourth connection point of a fourth memory device package immediately adjacent the second memory device package in the second row.

3. The memory module of claim 2, wherein the distance between the first and third connection points is substantially the same as the distance between the second and fourth connection points.

4. The memory module of claim 1, wherein the substrate comprises a module board and wherein at least a portion of the control single line comprises a microstrip or a strip line on and/or in the module board.

5. The memory module of claim 1, wherein the memory device packages and the control signal line are arranged by in a fly-by configuration.

6. The memory module of claim 1, wherein another memory device package in the first row is connected to the control signal line at a third connection point next closest to the second connection point or another memory device package of the second row is connected to the control signal line at a third connection point next closest to the second connection point.

7. The memory module of claim 1, wherein a memory device package in a third row is connected to the control signal line at a third connection point next closest to the second connection point.

8. The memory module of claim 1, further comprising the controller.

9. The memory module of claim 8, further comprising a plurality of non-volatile memory devices connected to the controller, wherein the memory device packages serve as a buffer configured to temporarily store data read from the non-volatile memory devices.

10. A solid state disk, comprising:
- a plurality of non-volatile memory devices;
- a controller configure to read data from the non-volatile memory devices; and
- a buffer memory device configured to temporarily store the data read from the non-volatile memory devices, the buffer memory device comprising:
  - a control signal line having a proximal end coupled to the controller; and
  - at least two rows of memory device packages individually coupled to the control signal line at respective connection points spaced along the control signal line such that the control signal line runs from memory device package to memory device package, wherein a first memory device package in a first row is connected to the control signal line at a first connection point closest to the proximal end of the control signal line and a second memory device package in a second row is connected to the control signal line at a second connection point next closest to the first connection point.

11. The solid state disk of claim 10, wherein a signal trace length along the control signal line between the first connection point and the second connection point is greater than a distance between the first connection point and a third connection point for a third memory device package immediately adjacent the first memory device package in the first row or a distance between the second connection point and a fourth connection point for a fourth memory device package immediately adjacent the second memory device package in the second row.

12. The solid state disk of claim 10, wherein another memory device package in the first row is connected to the control signal line at a third connection point next closest to the second connection point or another memory device package of the second row is connected to the control signal line at a third connection point next closest to the second connection point.

13. The solid state disk of claim 10, wherein a memory device package in a third row is connected to the control signal line at a third connection point next closest to the second connection point.

14. A buffer memory device comprising:
- a control signal line having a proximal end configured to be coupled to a controller; and
- a plurality of memory device packages connected to the control signal line at respective connection points in a fly-by configuration, wherein a first distance between a first connection point closest to the proximal end and a second connection point next closest to the first connection point is different than a second distance between the second connection point and a third connection point next closest to the second connection point.

15. The buffer memory device of claim 14, wherein the memory device packages are arranged in rows, and wherein a first memory device package connected at the first connection point is in a first row and a second memory device package connected at the second connection point is in a second row.

16. The buffer memory device of claim 15, wherein a third memory device package connected at the third connection point is the first row or the second row.

17. The buffer memory device of claim 16, wherein the third memory device is in a third row.

18. The buffer memory device of claim 17, wherein the third row is disposed between the first and second rows.

19. The buffer memory device of claim 17, wherein the second row is disposed between the first and third rows.

* * * * *